United States Patent
Kons et al.

(10) Patent No.: US 8,549,377 B1
(45) Date of Patent: Oct. 1, 2013

(54) EFFICIENT DECODERS FOR LDPC CODES

(75) Inventors: Shachar Kons, Haifa (IL); Yoav GoldenBerg, Kiryat Bialik (IL); Gadi Kalit, Nahariya (IL); Eran Arad, Misgav (IL); Shimon Gur, Haifa (IL); Ronen Hershkovitz, Haifa (IL)

(73) Assignee: Entropic Communications, Inc., San Diego, CA (US)

( * ) Notice: Subject to any disclaimer, the term of this patent is extended or adjusted under 35 U.S.C. 154(b) by 158 days.

(21) Appl. No.: 12/848,905

(22) Filed: Aug. 2, 2010

Related U.S. Application Data

(62) Division of application No. 11/303,449, filed on Dec. 16, 2005, now Pat. No. 7,770,090.

(60) Provisional application No. 60/717,535, filed on Sep. 14, 2005.

(51) Int. Cl.
*H03M 13/29* (2006.01)

(52) U.S. Cl.
USPC .......................................................... 714/755

(58) Field of Classification Search
USPC .............................. 714/752, 755, 780
See application file for complete search history.

(56) References Cited

U.S. PATENT DOCUMENTS

| | | | |
|---|---|---|---|
| 6,404,828 B2 | 6/2002 | Kaewell, Jr. | |
| 6,539,367 B1 | 3/2003 | Blanksby et al. | |
| 7,020,829 B2 * | 3/2006 | Eroz et al. | 714/794 |
| 7,143,336 B1 | 11/2006 | Moon et al. | |
| 7,179,691 B1 | 2/2007 | Lee et al. | |
| 7,206,364 B2 | 4/2007 | Miller | |
| 7,231,577 B2 | 6/2007 | Richardson et al. | |
| 7,266,750 B1 * | 9/2007 | Patapoutian et al. | 714/758 |
| 7,296,216 B2 | 11/2007 | Shen et al. | |
| 7,340,003 B1 | 3/2008 | Nazari et al. | |
| 7,395,495 B2 | 7/2008 | Jacobsen | |
| 7,414,551 B2 | 8/2008 | Lee et al. | |
| 7,418,051 B2 | 8/2008 | Kramer et al. | |
| 7,434,145 B2 | 10/2008 | Jin et al. | |
| 7,461,328 B2 | 12/2008 | Dabiri et al. | |
| 2004/0194007 A1 | 9/2004 | Hocevar | |
| 2005/0007262 A1 | 1/2005 | Craven et al. | |

OTHER PUBLICATIONS

Jin et al., "Design of low-density parity-check codes for noncoherent MPSK communication", ISIT 2002, Jul. 2002, p. 169.*

(Continued)

*Primary Examiner* — Stephen M Baker
(74) *Attorney, Agent, or Firm* — Bruce Greenhaus; Richard Bachand; Duane Morris LLP

(57) ABSTRACT

An LDPC decoder, applicable to LDPC codes including codes where check nodes within the same group are connected to a common bit node, successively processes groups of check nodes in a particular iteration, including updating bit nodes in that same iteration responsive to messages generated in response to processing a group of check nodes. Within an iteration, the LDPC decoder may also track the number of unresolved parity check equations, and cease iterating or output to an outer block decoder if that number reaches a local minima or standard minimum, falls below a predetermined threshold, or its rate of change falls below a predetermined threshold, indicating a lack of convergence or false convergence condition. The LDPC decoder may also provide a feedback assist to a demodulator. Also, a novel memory configuration may store messages generated by the decoder in the course of check node processing. The decoder may also employ a novel method for generating check node to bit node messages through a prescribed series of pair-wise computations.

9 Claims, 14 Drawing Sheets

(56) References Cited

OTHER PUBLICATIONS

Narayanan et al., "On the Design of LDPC Codes for MSK", GLOBECOM 2001, pp. 1011-1015.*

European Search Report corresponding to the related European Patent Application No. 06773833.6 mailed on Nov. 8, 2011.

Zhang, et al., "Shuffled Belief Propagation Decoding," Dept. of Electrical Engineering, Univ. of Hawaii at Manoa, IEEE, pp. 8-15, vol. 1, Nov. 3, 2002.

Sharon, et al., "An Efficient Message-Passing Schedule for LDPC Decoding," IEEE., pp. 223-226, Sep. 6, 2004.

"A Reduced Complexity Decoder Architecture via Layered Decoding of LDPC Codes," Dale E. Hocevar, DSP Solutions R&FD Center, Texas Instruments, Dallas, TX, SIPS 2004, pp. 107-112.

* cited by examiner

|  | M soft values | | | | | |
|---|---|---|---|---|---|---|
| 0 | q | 3q | 4q | 5q | ... | (M-1)q |
| 1 | 1+2q | 1+3q | 1+4q | 1+5q | ... | 1+(M-1)q |
| 2 | 2+2q | 2+3q | 2+4q | 2+5q | ... | 2+(M-1)q |
| . | . | . | . | . | . | . |
| q-1 | 2q-1 | 3q-1 | 4q-1 | 5q-1 | ... | Mq-1 |

(#edges)/M ↕    Extrinisc messages from the same node ↕

FIG. 11(b)

EFFICIENT DECODERS FOR LDPC CODES

This application is a divisional of application Ser. No. 11/303,449, filed Dec. 16, 2005, now U.S. Pat. No. 7,770,090 which claims the benefit of U.S. Provisional Application No. 60/717,535, filed Sep. 14, 2005, which is hereby fully incorporated by reference herein as though set forth in full, and relates to U.S. patent application Ser. No. 11/303,876, filed Dec. 16, 2005, entitled "MULTI-CHANNEL LDPC DECODER ARCHITECTURE," which is hereby fully incorporated by reference herein as though set forth in full.

BACKGROUND OF THE INVENTION

1. Field of the Invention

This application relates generally to decoders for Low Density Parity Check (LDPC) codes, and, more specifically, to increasing the efficiency of such decoders.

2. Related Art

LDPC decoders are characterized by a parity check matrix, the rows of which define parity check equations for checking whether a candidate LDPC code word is valid or not. In particular, the bits in a row of the matrix define the bits in a candidate code word that, when XORed together, must produce a zero result for a code word to be valid. When a code word satisfies, i.e., resolves to zero, all the parity check equations implied by a parity check matrix, the code word is deemed to be valid.

Current LDPC decoders, employing a check node/bit node structure that tracks the parity check equations of the parity check matrix, iterate until a predetermined exit condition is satisfied, for example, the condition when all of the parity check equations are resolved to zero, or when a fixed number of iterations have been completed. Each iteration proceeds in two steps. In the first step, each of the check nodes is processed by computing the XOR of the hard decision, total bit estimates for all connected bit nodes, and then generating update messages for each of these bit nodes, responsive to soft decision, extrinsic bit estimates for these bit nodes. In the second step, the bits nodes are updated in response to the update messages generated in the first step. Significantly, the second step does not begin until all the check nodes have completed the first step. That in turn increases the time for the decoder to converge.

Although efforts have been made to overlap check node and bit node processing within an iteration, see US 2004/0194007, Hocevar, "Layered Low Density Parity Check Decoding For Digital Communications," filed Mar. 23, 2004, and "A Reduced Complexity Decoder Architecture Via Layered Decoding Of LDPC Codes," Dale E. Hocevar, IEEE SIPS 2004, pp. 107-112, these efforts have been limited to specific LDPC codes, for example, those in which all of the columns of the parity check matrix for a group have a weight of one or less, implying that none of the check nodes within the group share the same bit node. Since LDPC codes in general violate this constraint, these efforts have not been significant.

Current LDPC decoders also do not detect or counteract certain abnormal conditions, for example, the situation where, with certain code words, the number of bit errors does not converge to zero with the number of iterations, but instead oscillates, without converging to zero, or converges to a certain non-zero floor. Consequently, a current LDPC decoder encountering abnormal conditions such as these will either cycle repeatedly or else time out without producing a decoded result free of bit error.

Current LDPC decoders are also ineffective when the number of iterations required to decode successive frames of LDPC encoded data significantly varies. If, for example, the clock rate of the decoder is set based on the average number of iterations required per signal, and the rate at which the frames are received, the decoder may encounter a problem when encountering a frame that requires a greater number of iterations to decode that significantly exceeds the average number. Either the decoding operation is cut short, thus resulting in decoded information with bit errors, or else data loss occurs.

SUMMARY

The invention provides an innovative method of iteratively decoding LDPC encoded information that, in one embodiment, involves processing groups of check nodes in parallel, where check nodes within the same group, or check nodes in different groups, can be connected to the same bit node. A first group of check nodes is processed in parallel during a particular iteration of the method, and then, before a second group of check nodes is processed in parallel during the iteration, the bit nodes connected to the check nodes in the first group are updated based on the messages generated by the check nodes in the first group. Once these bit nodes have been updated, the second group of check nodes is then processed.

Unlike the prior art, the processing of these bit nodes is not deferred until all the check nodes in all the groups have been processed. Instead, the updated bit nodes are acted upon sooner than in the prior art. In fact, the updated bit nodes are acted upon in the current iteration, as soon as a check node is encountered that is connected to one of the bit nodes that has been updated. Convergence is thus possible with a fewer number of iterations compared to the prior art. Moreover, unlike the prior art, the method handles LDPC codes where the portion of a column of the parity check matrix corresponding to a check node group has a weight greater than one, indicating that the check nodes within a group can share bit nodes.

In a second embodiment, estimated information is updated for each iteration of the method and then checked against a plurality of parity check equations characterizing the particular code that is used. If the estimated information resolves all the parity check equations, then the estimated information is outputted as the decoded information. If, on the other hand, some of the parity check equations remain unresolved, but the number of unresolved equations, which serves as a proxy for the number of bit errors remaining in the estimated information, satisfies a predetermined condition, for example, falls below a predetermined threshold, or is a local or global minimum, then the estimated information is outputted as the decoded information even though it may include some bit errors. If some of the parity check equations remain unresolved, and the number of unresolved equations does not satisfy the predetermined condition, the method continues iterating.

This embodiment of the method is useful in a variety of applications. For example, in an application where the bit error rate is oscillating without converging to zero as the number of iterations increases, the method may be used to detect this condition when the number of unresolved check equations, which serves at the number as a proxy for the number of bit errors in the estimated information, achieves a local or global minimum. Upon detection of this condition, the estimated information is outputted as the decoded information, even though it may contain bit errors, because additional iterations will not serve to decrease the number of bit errors. Rather, as shown in FIG. 1(c), additional iterations may actually increase the number of bit errors.

In an application where an outer encoder is used, for example, an outer BCH encoder, the method may be used to detect when the number of unresolved check equations falls below a predetermined threshold, indicative, for example, of the number of bit errors that can be corrected by the decoder for the outer block code. At this point, the method outputs the estimated information to the decoder for the outer block code, which continues processing the information with the aim of eliminating any bit errors that are still present through the block decoding process.

In an application where the bit error rate has converged to a non-zero value, the method may be used to detect when the rate of change in the number of unresolved check equations falls below a predetermined threshold indicating that the bit error rate has falsely converged to the non-zero value. At this point, a nudge algorithm is applied to incrementally reduce the probabilities of the bit estimates for all the bit nodes that are implicated by the parity check equations that remain unresolved. The method then resumes iterating towards a solution. Hopefully, by de-emphasizing the participating bit estimates, the method can converge to zero, yielding a valid codeword with no decoding errors.

In a third embodiment, a plurality of buffers is provided for storing LDPC encoded frames as they are received. A suitable scheduling policy, for example, round robin, may then applied to multiplex the LDPC decoder amongst the various buffers. When assigned to a buffer, the decoder performs one or more decoding iterations. When a received signal has been successfully decoded, the buffer containing the signal is freed and made available for storing another received signal.

Provided a suitable number of buffers is provided to account for factors such as the decoder clock rate, the rate at which the encoded frames are received, and the frequency and severity of the variations in number of required iterations, significant variations in the number of required iterations, as well as variations where the number of required iterations exceed the average number of required iterations, can be accommodated.

In a fourth embodiment, an innovative method of generating bit node update messages during check node processing in a LDPC decoder is provided. In this embodiment, for each check node, the method performs a plurality of pair-wise log-likelihood ratio (LLR) computations to build up a tree of LLR values. Then, for each bit node, the method selects a highest level spanning set of LLR values from the tree that span all bit nodes except for the bit node in question. The method then successively performs pair-wise LLR computations on the selected values, to produce the update message for that bit node. This method achieves efficiency advantages by maintaining a small number of operations that must be performed to produce the update messages.

The invention also provides one or more architectural innovations in the decoder itself. In one embodiment, a novel memory configuration for storing bit node update messages produced during check node processing is provided for use in a decoder where the bit nodes and check nodes are interconnected by a total of K edges, the check node nodes are organized into groups of P nodes each for processing in parallel, and successive check nodes in a group are spaced by q check nodes.

According to this configuration, a memory having M rows and N columns is provided, where M is greater than or equal to the number P of check nodes in a group, and N corresponds to K/M. In addition, updates messages from the same check node destined for different bit nodes are stored in successive (although not necessarily consecutive) rows.

The invention also provides one or more innovative systems for decoding an LDPC decoder. In one embodiment, a system for LDPC decoder feedback assist to a demodulator is provided. In this system, a demodulator is configured to demodulate a received LDPC encoded signal, including quantizing the demodulated signal into a symbol selected from a predetermined symbol constellation. An LDPC decoder is configured to iteratively decode the LDPC encoded information for a predetermined number of iterations or until the number of unresolved parity check equations for an iteration falls below a predetermined threshold to produce partially decoded information. A remapper is configured to remap the partially decoded information into a symbol from the symbol constellation. A feedback loop is configured to feed the remapped symbol back to the demodulator, along with optional soft information indicating the reliability of the symbol, to assist in selecting symbols from the symbol constellation.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

FIG. 7(a) is a block diagram of a concatenated encoder with an outer block encoder and an inner LDPC encoder, while

DETAILED DESCRIPTION

A first embodiment of the invention comprises a hybrid LDPC decoder, a decoder for LDPC codes having the following two properties:

1.) The structure of the LDPC code allows parallel processing of groups of check nodes simultaneously. These check nodes groups can also be referred to as groups of rows in the LDPC code's parity check matrix.

2.) In at least one of the above check nodes groups, there are at least two check nodes that are connected to one bit node. Referring to the parity check matrix of the LDPC code, in at least one of group of rows there is a column with a weight that is greater than one.

Figure 1:
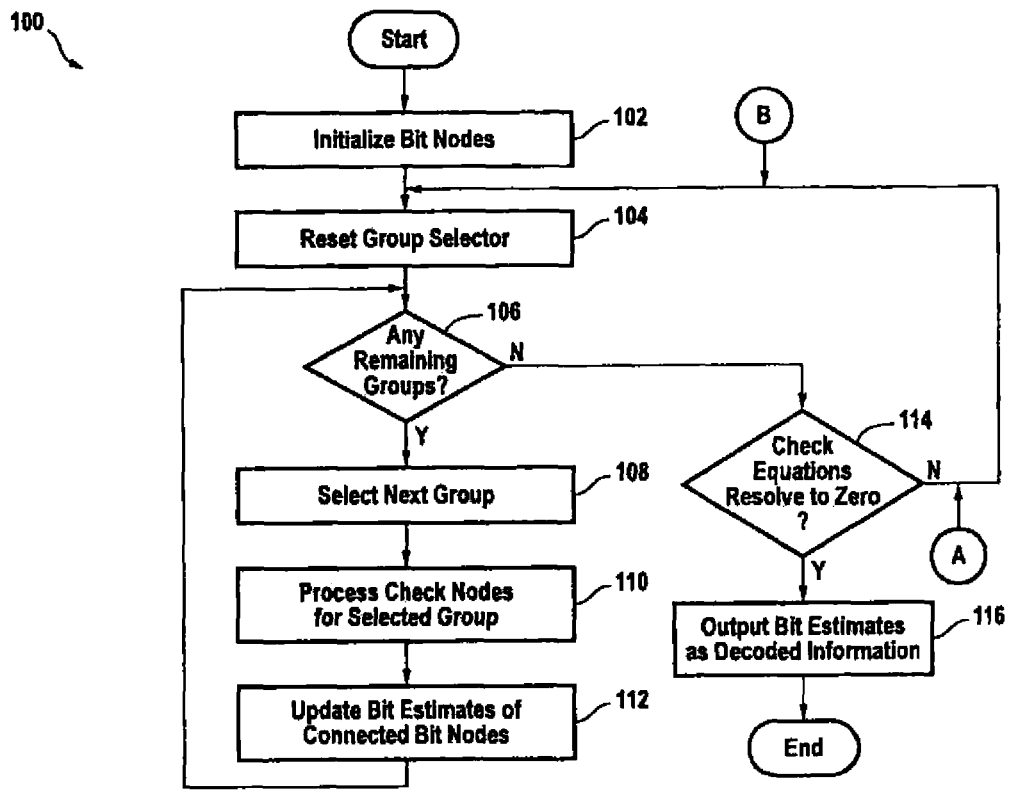
FIG. 1 is a flowchart of a method of operating a hybrid LDPC decoder applicable to codes in which check nodes in a group may be connected to the same bit node, in which the decoder successively processes groups of check nodes in an iteration, and, after processing a group of check nodes in an iteration, updates the connected bit nodes before processing the next group of check nodes.

FIG. 1 depicts a flowchart of the decoding method 100 employed by this hybrid LDPC decoder. The method is iterative and contemplates dividing up the check nodes into groups. Within each iteration, all the groups of check nodes are sequentially processed, with the check nodes in each group processed in parallel. The method continues to iterate until all the check node equations are resolved to zero.

Turning to FIG. 1, the method begins with box 102, initializing the bit nodes with initial estimations. Box 102 is followed by box 104, resetting a group selector, a selector for selecting one of the groups of check nodes to be processed. Box 104 is followed by query diamond 106, which queries whether there are any remaining groups of check nodes to be processed for the current iteration. If so, the method proceeds to box 108. If not, the method proceeds to query diamond 114.

In box 108, the method selects the next group of check nodes to be processed. Box 108 is followed by box 110. In box 110, the check nodes for the currently selected group are processed in parallel. The act of processing a group of check nodes involves:

Sending messages from bit nodes to check nodes, messages that, in one implementation, include information from all connected check nodes, except from the target check node. Such information may be referred to as extrinsic information.

Computing new estimations for the connected bit nodes in every check node and sending these estimations as messages back to the bit nodes.

Box 110 is followed by box 112. In box 112, the bit estimates for the connected bit nodes are updated in response to the check node to bit node messages.

The method then loops back to query diamond 106, and continues to loop until all the groups have been processed. When all check nodes groups have been processed, a decoding iteration is deemed completed, and the method branches to query diamond 114. In query diamond 114, the method determines whether the current bit estimates fully resolve all the parity check equations to zero. If so, a successful decoding operation has occurred, and the method proceeds to box 116. In box 116, the current bit estimates are outputted as the decoded information. Otherwise, the method loops back to the input side of box 104 for another iteration.

The principal difference between this method and the conventional method applicable to LDPC codes in general, including LDPC codes where check nodes in the same group can be connected to the same bit node, is that the bit nodes computations and the check nodes computations within an iteration are not performed in two separate phases. Instead, in the above method, a check node uses messages from bit nodes that were updated from other check node groups in the current iteration. The method differs from the conventional method, where a check node uses messages from bits nodes that were updated in the previous iteration. Consequently, compared to the conventional method, the method here processes updates of the bit nodes sooner, which allows for a more rapid convergence, and hence fewer decoding iterations.

Figure 2A:
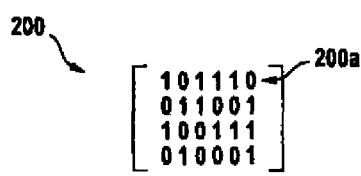
FIG. 2(a) is an example of a parity check matrix.
Figure 2B:
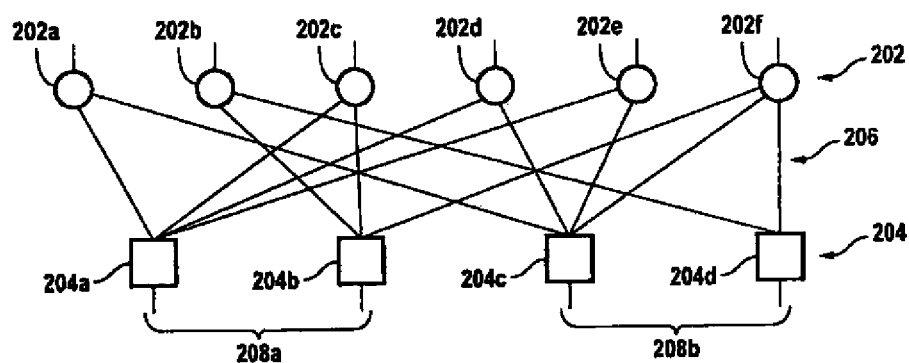
FIG. 2(b) illustrates an interconnected assembly of check and bit nodes that corresponds to this parity check matrix.

FIGS. 2A-2B illustrate this difference in the context of a specific example. FIG. 2A illustrates a parity check matrix 200 for a particular LDPC code. FIG. 2B illustrates the decoder structure implied by this parity check matrix. Numeral 202 identifies the bit nodes, one for each column of the parity check matrix 200. Each bit node is associated with a corresponding hard decision, total bit estimate (not shown), and one or more soft decision, extrinsic bit estimates (not shown). Numeral 204 identifies the check nodes, one for each row of the parity check matrix 200. Numeral 206 identifies the connections between the bit nodes and the check nodes. Such a connection is present for every logical "1" in the parity check matrix. Consider, for example, check node 204a, corresponding to row 200a of the matrix 200. Connections are present between this check node and each of the bit nodes corresponding to the logical "1"'s in row 200*a*. These bit nodes are identified with numerals 202*a*, 202*c*, 202*d*, and 202*e*. A similar relationship holds between the connections for each of the remaining check nodes and the remaining rows of the matrix 200.

The check nodes 204 are divided into two groups, identified with numerals 208*a* and 208*b*. In a particular iteration, the two groups are processed sequentially, group 208*a* followed by group 208*b*. Within a group, the check nodes are processed in parallel. In this particular example, a check node is processed by XORing the hard decision, total bit estimates for all connected bit nodes, and also generating update messages from the soft decision, extrinsic bit estimates from the connected bit nodes.

If the result of XORing the hard bit estimates is zero, indicating the parity check equation corresponding to the check node resolves to zero, the parity check equation is deemed satisfied. Regardless of whether the parity check equation is or is not satisfied by the current bit estimates, then update messages are generated for each of the connected bit nodes responsive to the soft decision, extrinsic bit estimates for these bit nodes, indicating updates for each of the hard decision, total bit estimates corresponding to the connected bit nodes.

Thus, for example, check node 204*a* is processed by XORing the hard decision, total bit estimates corresponding to bit nodes 202*a*, 202*c*, 202*d* and 202*e*. Update messages are then generated for each of these bit nodes responsive to the soft decision, extrinsic bit estimates for these bit nodes. In parallel with the foregoing, check node 204*b* is processed by XORing the hard decision, total bit estimates corresponding to bit nodes 202*b*, 202*c*, and 202*f*. Again, update messages are then generated for each of these bit nodes responsive to the soft decision, extrinsic bit estimates for these bit nodes.

Since all the bit nodes are connected to the check nodes in the first group, collectively, the processing of the first group 208*a* results in check node to bit node messages for each of the bit nodes. Before the second group 208*b* is processed, the hard decision, total bit estimates are updated in response to the update messages generated through the processing of the first group. Once these hard decision, total bit estimates have been updated, the second group is then processed. Since the processing of the second group is performed responsive to updated hard decision, total bit estimates that reflect the update messages resulting from the group one processing, the method converge faster than with the conventional method, which would have processed the second group responsive to bit estimates that did not reflect the processing of the first group.

As discussed, the check nodes are processed by generating update messages responsive to soft decision, extrinsic bit estimates for the connected bit nodes, which may vary depending with the check node that is the destination of the estimate. A soft decision, extrinsic estimate reflects messages originating from other check nodes in the group in a previous iteration, but excludes any message to the bit node generated through processing of the check node in question in the previous iteration.

Figure 3:
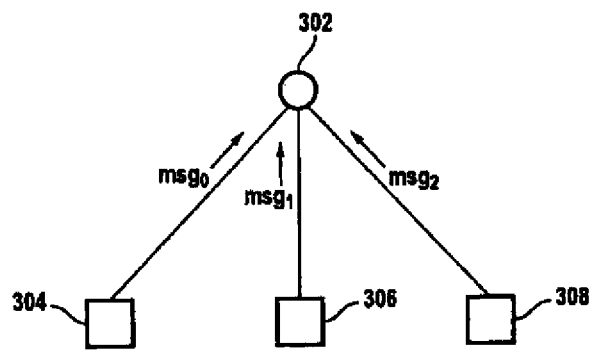
FIG. 3 shows the process of updating a bit node connected to several check nodes, providing context for an explanation in the specification of extrinsic message generation.

Thus, referring to FIG. 3, showing bit node 302, connected check nodes 304, 306, and 308, all of which are in the same group, and check node to bit node messages $msg_0$, $msg_1$ and $msg_2$, generated in the previous iteration, the soft decision, extrinsic bit estimate for check node 304 for use in the current iteration is the initial estimate at the start of the received frame decoding, $\lambda_{initial}$, plus the sum of all the messages generated in the previous iteration, $\Sigma msg_i$, minus the message generated by that bit node in the previous iteration, $msg_0$. In contrast, the soft decision, extrinsic bit estimate for check node 306 for use in the current iteration is the initial estimate at the start of the received frame decoding, $\lambda_{initial}$, plus the sum of all the messages generated in the previous iteration, $\Sigma msg_i$, minus the message generated by that bit node in the previous iteration, $msg_i$. Finally, the soft decision, extrinsic bit estimate for check node 308 for use in the current iteration is the initial estimate at the start of the received frame decoding, $\lambda_{initial}$, plus the sum of all the messages generated in the previous iteration, $\Sigma msg_i$, minus the message generated by that bit node in the previous iteration, $msg_2$.

Figure 4:
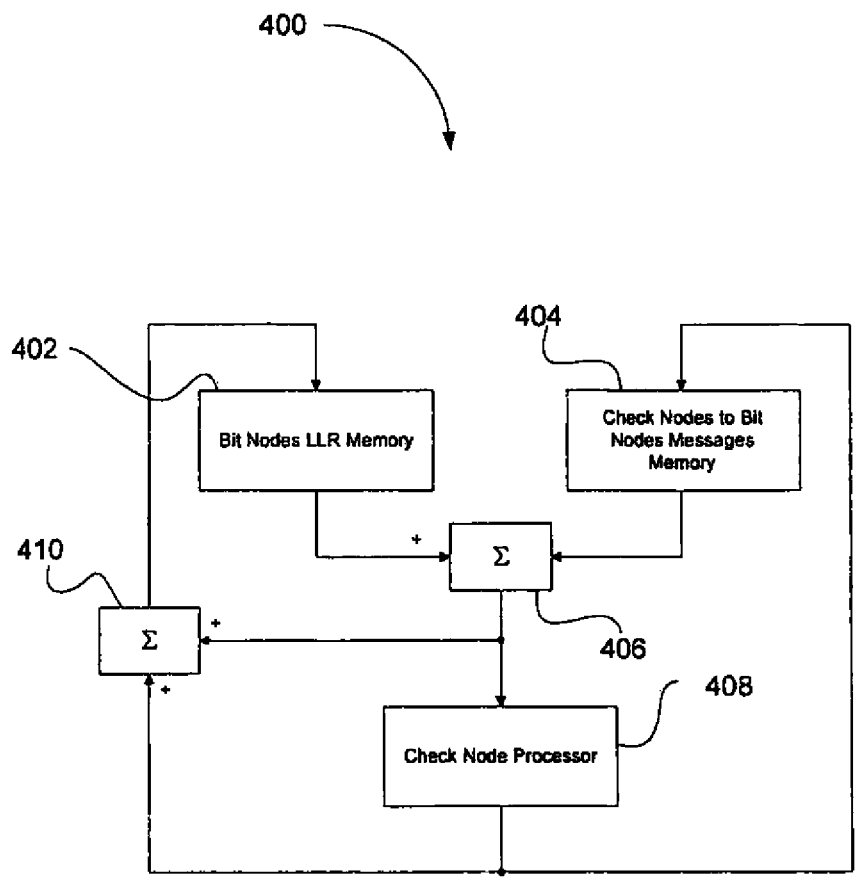
FIG. 4 is an implantation of a hybrid LDPC decoder configured to perform the method of FIG. 1, characterized by a "Bit Nodes LLR Memory" for holding LLR soft estimates for each of the bit nodes, a "Check Nodes to Bit Nodes Messages Memory" for holding check nodes to bit nodes messages generated in the course of check nodes processing, and a Check Node Processor for processing a group of check nodes in parallel.

FIG. 4 illustrates an efficient decoder implementation of the foregoing method that uses Log-Likelihood-Ratios (LLRs) for the initial estimations of the bit nodes. These LLRs are stored in a "Bit nodes LLR memory" 402 and updated through each iteration of the method. A "Check Nodes to Bit Nodes Messages Memory" 404 is used for storing the check nodes to bit nodes messages generated in an iteration.

In each iteration, the implementation performs the following steps for each of the check nodes groups:

1. For each connection between a bit node and a member of the group, reading an LLR for a bit node terminating the connection from the "Bit nodes LLR memory" 402, and producing an extrinsic estimate by using Subtractor 406 to subtract the message from the previous iteration associated with that connection as obtained from the "Check Nodes to Bit Nodes Messages Memory" 404.

2. Responsive to the extrinsic estimates, process in parallel the group of check nodes in the "Check Node Processor" 408, which may be implemented with multiple processors configured for parallel operation, thereby generating new check nodes to bit nodes messages.

3. For each connection between a bit node and a group member, reading an LLR for the bit node terminating the connection, using Subtractor 406 to subtract the message from the previous iteration associated with that connection as obtained from the "Check Nodes to Bit Nodes Messages Memory" 404, using Adder 410 to add the new message for that connection as generated in the current iteration, and storing the resulting value back in the "Bit nodes LLR memory" 402.

4. Updating the "Check Nodes to Bit Nodes Messages Memory" 40 with the new check node to bit nodes messages as computed in the "Check Node Processor" 408.

A second embodiment of the invention addresses the inherent instability of an iterative LDPC decoder that arises because of the feedback loop that is present between the decoder outputs and inputs. Due to this feedback, the decoder's output may oscillate, without converging to a proper solution.

Figure 5:
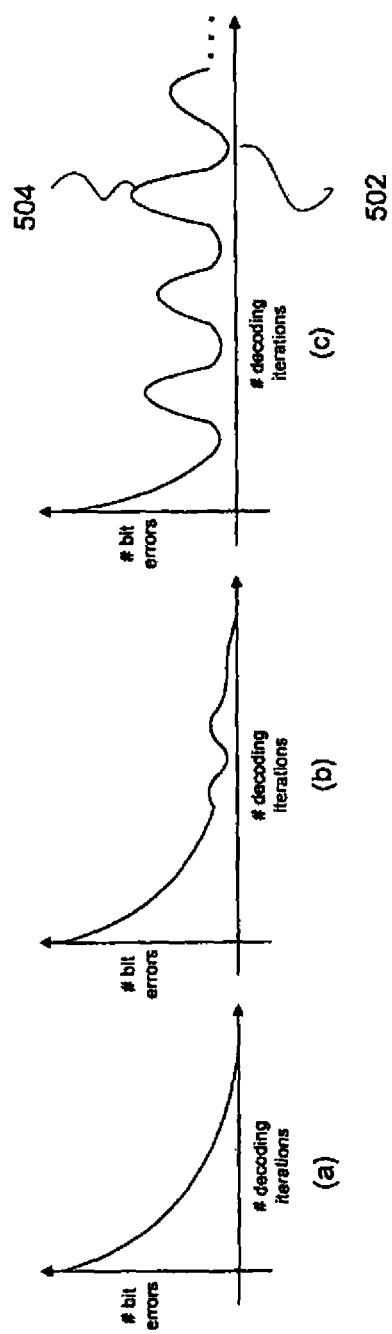
FIG. 5(a) depicts normal convergent behavior of an LDPC decoder.
FIG. 5(b) depicts a benign condition where the LDPC decoder converges after oscillating.
FIG. 5(c) depicts a more malignant condition where the LDPC decoder oscillates and does not converge.

Usually, the number of erroneous output bits decreases with the number of decoding iterations as shown in FIG. 5(*a*), until all the erroneous bits are resolved. Sometimes, as shown in FIG. 5(*b*), the decoder has small oscillations over a few unresolved bits, until it corrects them, ending up with no errors. However, on rare occasions, the decoder does not converge at all, and the number of erroneous bits oscillates significantly, as shown in FIG. 5(*c*), with the magnitude and frequency of these oscillations depending upon the specific code, the decoding algorithm and the signal to noise ratio of the decoded signal. If the decoder has no indication of this phenomenon, the decoder output, comprising the bit estimates that are present when the decoder performs its last iteration, could contain a significant number of bit errors. In fact, when measuring the bit error rate at the output of the decoder, this phenomenon will result in a bit error rate floor.

To detect this phenomenon, this second embodiment utilizes the number of unresolved parity check equations, which has a very good correlation with the number of erroneous bits, as a proxy for the number of erroneous bits. During each iteration, it tracks the number of unresolved parity check equations. When the number reaches a local or global minimum, the decoder stops iterating and outputs the estimated bits as the decoded information. Although these bits contain some errors, the number of errors that are present, which is assumed to correlate with the number of unresolved parity check equations, is at a minimum. Therefore, these estimated bits are considered to be the best output possible. Referring to FIG. 5(c), for example, through practice of the second embodiment, the estimated bits output by the decoder would be at the point identified with numeral 502, where the number of bit errors is at a minimum. That is far preferable than outputting the estimated bits at the point identified with numeral 504, where the number of bits errors is at a maximum, a possible result if the second embodiment is not practiced, and no tracking of the number of unresolved check equations occurs.

There are many possible ways for implementing this second embodiment, for example:

Standard Minimum Search—

A register is used to hold the minimum number of unsolved parity check equations. Every decoding iteration, it is compared to the current number of unsolved parity check equations. If there are less unsolved parity check equations, the estimated bits for the iteration are output from the decoder, for example, by storing them in a memory, and the register is updated to the new minimum value.

Figure 6A:
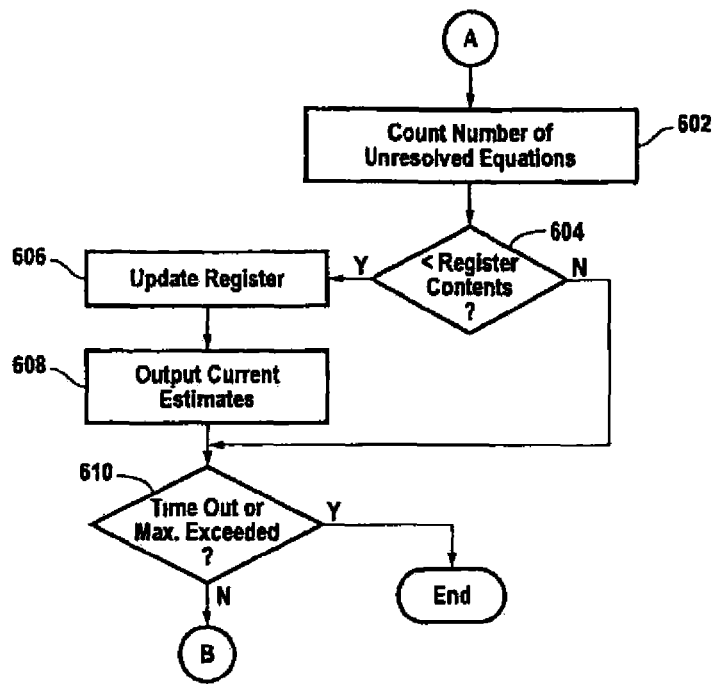
FIG. 6(a) depicts, in flowchart form, a modification to the flowchart of FIG. 1 for tracking by iteration the number of unresolved parity check equations and ceasing iterations when the number reaches a standard minimum.

FIG. 6(a) is an incremental portion of a flowchart embodying this particular implementation that is intended to augment the flowchart of FIG. 1 by replacing the unadorned A-B segment indicated there, representing the "no branch from query diamond 114, with the FIG. 6(a) flowchart. Thus, the processing represented by FIG. 6(a) flowchart occurs after it has been determined in a particular iteration (in query diamond 114) that the current bit estimates do not resolve all the parity check equations.

Turning to FIG. 6(a), after this has been determined, box 602 is performed. In box 602, the number of unresolved check equations is counted. Box 602 is followed by query diamond 604, which queries whether the current number of unresolved check equations is less than the contents of a register holding the minimum number of unresolved check equations that has been encountered so far in a previous iteration. If so, box 606 is performed. If not, boxes 606 and 608 are skipped. In box 606, the register is updated with the number of unresolved check equations for the current iteration. Box 608 is then performed. In box 608, the bit estimates for the current iteration is output from the decoder as the decoded information, replacing at the recipient any previous output from the decoder.

Query diamond 610 is then encountered. In query diamond 610, a query is made with a predetermined time out condition, such as exceeding a predetermined number of iterations, has occurred. If so, the processing concludes. If not, processing resumes at box 104 in FIG. 1.

First Minima Search—

A register is used to hold the previous iteration's number of unsolved parity check equations. When the number of unsolved parity check equations in the current iteration is equal or higher than the register contents, then the bit estimates for the previous iteration are output from the decoder. This method finds the first minima of the number of unsolved parity check equations.

Figure 6B:
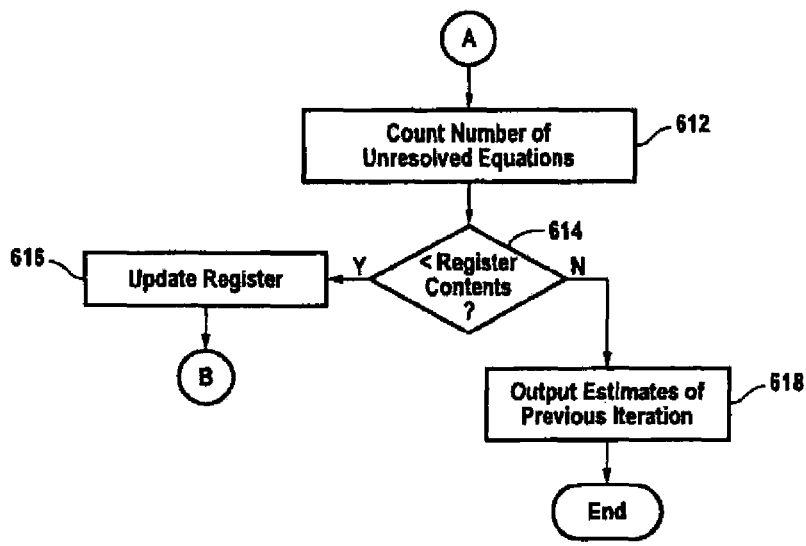
FIG. 6(b) depicts a similar modification to the flowchart of FIG. 1 for tracking by iteration the number of unresolved parity check equations and ceasing iterations when the number reaches a local minima.

FIG. 6(b) is an incremental portion of a flowchart embodying this particular implementation that is again intended to augment the flowchart of FIG. 1 by replacing the unadorned A-B segment indicated there, representing the "no branch from query diamond 114, with the FIG. 6(b) flowchart. Thus, the processing represented by FIG. 6(b) flowchart occurs after it has been determined in a particular iteration (in query diamond 114) that the current bit estimates do not resolve all the parity check equations.

Turning to FIG. 6(b), after this has been determined, box 612 is performed. In box 612, the number of unresolved parity check equations for the current iteration is counted. Box 612 is followed by query diamond 614, which queries whether the current number of unresolved parity check equations is less than a register holding the number of unresolved parity check equations from the previous iteration. If so, box 616 is performed. In box 616, the register is updated with the current number of unresolved parity check equations. Processing then continues with box 104 in FIG. 1. Turning back to query diamond 614, if the current number of unresolved parity check equations is not less than the register contents, box 618 is performed. In box 618, the bit estimates for the previous iteration are output as the decoded information.

Combination—

A combination of the foregoing two approaches is also possible, where a first minima search (FIG. 6(b) flowchart) is initially conducted, followed by a standard minima search (FIG. 6(a) flowchart).

As can be seen in FIG. 5(c), whichever of these approaches is utilized, during the first few iterations, the number of unsolved parity check equations (and erroneous bits) usually decreases monotonically. Therefore, in the case where the decoder output is written to memory, in order to avoid unnecessary write operations to the output memory (and thus save power and processing time) during these first few iterations, it is possible to use any of the foregoing approaches with one or more of the following enhancements:

1. Begin the search, whether first minima, standard minimum, combination of the two, or some other search, from a programmable, predetermined decoding iteration number and not from the first one.
2. Begin the search only if the number of unresolved parity check equations is smaller than a programmable, predetermined threshold.
3. Begin the search only if the difference between the number of unresolved parity check equations in two consecutive iterations is smaller than a programmable, predetermined threshold.

Figure 7A:
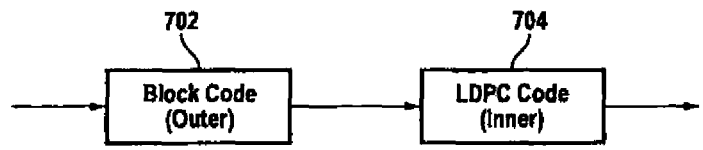
Figure 7B:
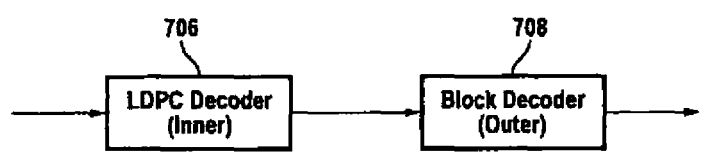
FIG. 7(b) is a block diagram of the corresponding decoding system.

A third embodiment of the invention involves a concatenated coding structure, illustrated in FIG. 7(a), comprising an outer block code 702, for example, a Bose, Chaudhuri and Hocquenghem (BCH) code, and an inner LDPC code 704. A corresponding decoding system, illustrated in FIG. 7(b), comprises an LDPC decoder 706, employing an iterative LDPC process, such as that illustrated in FIG. 1, modified in the manner to be described, followed by an inner block decoder 708.

In this embodiment, the iterative LDPC processor is modified to periodically check, for example, every nth iteration, where n in an integer of 1 or more, whether the number of unsolved parity check equations falls below a predetermined, programmable threshold. If so, the current estimated bits are output from the LDPC decoder 706, and input to block decoder 708.

The predetermined threshold may be set with the error correction capability of the block decoder 708 in mind, for example, by setting the threshold low enough that the iterations of the LDPC decoder progress to the point that the remaining number of bit errors is low enough that they can be corrected by the outer block decoder 708. Even when the output of the LDPC decoder 706 has some bit errors, this scheme will still result in a lower number of erroneous bits in the ultimate output of decoder 708 than a scheme in which an arbitrary number of iterations are employed in the LDPC decoder.

By exiting the block decoder 708 only when the number of unresolved parity check equations has fallen below the predetermined threshold, this implementation reduces the number of times the outer decoder 708 is used, thus saving power and processing time. For received signals that end up with an outer decoding failure, the above technique will still reduce the number of erroneous output bits comparing to an arbitrary number of LDPC decoding iterations.

Figure 8:
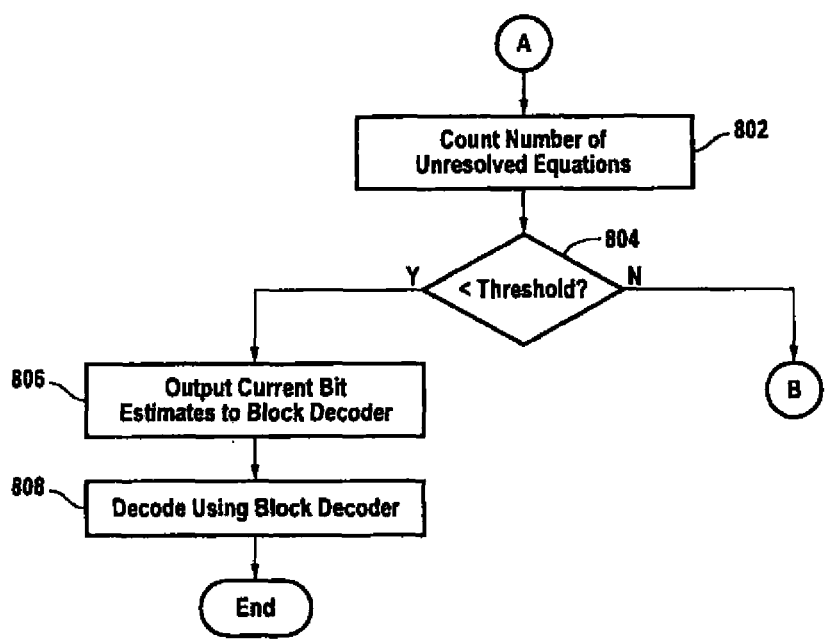
FIG. 8 depicts a modification to the flowchart of FIG. 1 for tracking by iteration the number of unresolved parity check equations and outputting the current estimated bit information to an outer block decoder when the number falls below a predetermined threshold.

FIG. 8 is an incremental portion of a flowchart embodying an implementation of this embodiment that is again intended to augment the flowchart of FIG. 1 by replacing the unadorned A-B segment indicated there, representing the "no" branch from query diamond 114, with the FIG. 8 flowchart. Thus, the processing represented by the FIG. 8 flowchart occurs after it has been determined in a particular iteration (in query diamond 114) that the current bit estimates do not resolve all the parity check equations.

In box 802, the number of unresolved parity check equations in the current iteration is counted. Query diamond 804 follows box 802. In query diamond 804, the number of unresolved parity check equations is compared with a threshold. If less than the threshold, a branch is made to box 806. If not less, a branch is made to box 104 in FIG. 1, and processing resumes.

In box 806, the current bit estimates are output to the outer block decoder. Box 808 follows box 806. In box 808, the bits are decoded using the block decoder. The output of the block decoder forms the output of the decoding system. Processing then concludes.

In one variant of this embodiment, in lieu of triggering the start of block decoding based on a predetermined threshold, the start of block decoding is triggered after the minimum number of unresolved parity check equations is found using one of the previously discussed searching methods, for example, first minima, standard minimum, combination of the two or some other searching method. Also as previously discussed, the search may be limited by starting the search only after a predetermined number of iterations or the change in the number of unresolved check equations is less than a predetermined threshold.

A fourth embodiment involves an LDPC decoder that performs recurring decoding operations, for example, upon periodic receipt of LDPC encoded signals or data frames. In this environment, the number of decoding iterations, which are required for correct decoding of a received signal, usually has a small variance, particularly when the received signals or data adhere to a signal to noise ratio that results in a low bit error rate at the output of the decoder. Therefore, for most of the received signals, the number of decoding iterations performed by the LDPC decoder is close to the average number of iterations. However, at times, the required number of decoding iterations that must be performed exceeds the average, thus increasing the complexity of the decoder, especially for high input data rates. If the decoder is unable to perform these many decoding iterations, bit errors will remain at the output.

To solve this problem, the fourth embodiment uses memory buffers to store the received signals before feeding them to the LDPC decoder. As long as the received signals that require many decoding iterations are sparse, and a sufficient number of buffers is present to prevent a memory overflow condition, these buffers allow the decoder to terminate its decoding iterations for each signal once all the parity check equations are resolved rather than before, even if the required number of iterations is greater than the average.

Figure 9A:
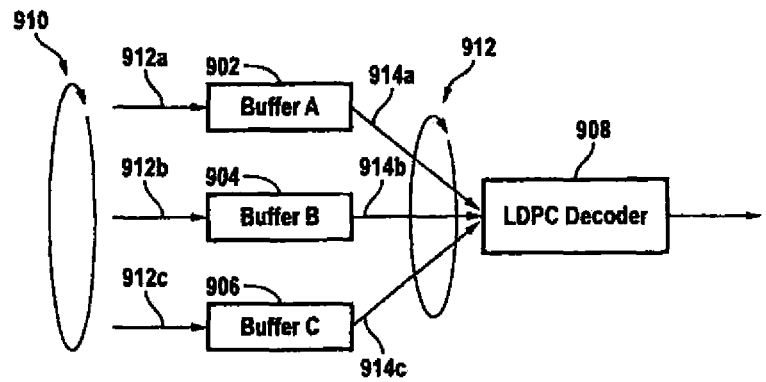
FIG. 9(a) is a block diagram of a LDPC decoding system in which incoming LDPC encoded symbols are buffered to allow the LDPC to dynamically vary the number of iterations applied to a particular signal, including situations where the required number of iterations exceeds the average number of required iterations.
Figure 9B:
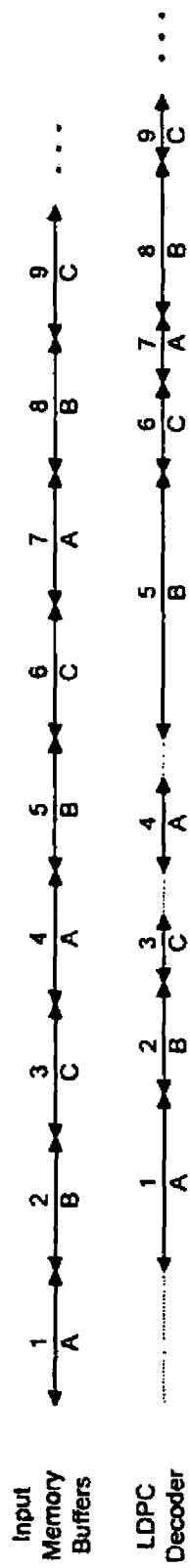
FIG. 9(b) is a timing diagram using for explaining the operation of the system of FIG. 9(a).

FIG. 9(*a*) illustrates an example of a decoding system implementing this fourth embodiment. In this particular example, the system has three buffers, A, B, and C, identified respectively with numerals 902, 904 and 906, each having inputs for receiving and storing LDPC encoded signals 912*a*, 912*b*, 912*c*, and an LDPC decoder 908 that is shared amongst the buffers, and receives respective outputs 914*a*, 914*b*, 914*c* from the buffers of the stored LDPC encoded signals for decoding thereof. The LDPC decoder 908 is multiplexed amongst the buffers in accordance with a suitable load balancing policy 912 that, in this particular example, is the policy of decoding the data in the order in which it is received. Once assigned to a particular buffer, the LDPC decoder 908 may perform all the iterations required to resolve all parity check equations in relation to the buffered signal.

Similarly, the incoming signals are stored in the respective buffers 902, 904, 906 in accordance with a suitable policy 910 that, in this particular example, is round robin, although again it should be appreciated that other allocation policies are possible.

An example of the operation of this system is shown in FIG. 9(*b*). The top line represents reception of LDPC encoded signals in the three input memory buffers—A, B and C—with the size of the arrow indicating the time during which an LDPC encoded signal is loaded into the respective buffer. The received LDPC encoded signals are marked with numbers 1-9 and are assigned to the buffers on a round robin basis. Thus, the first received signal is stored in buffer A, the second in buffer B, the third in buffer C, the fourth is buffer A, etc. The arrow size is the same for all the received signals because the reception time is the same for all received signals in this particular example.

The bottom line represents allocation of the LDPC decoder to a particular buffer, with, the arrow size indicating the time spent in decoding the signal stored in the buffer. Initially, the decoder is in an idle state until received signal 1 is stored completely in buffer A. Then, while received signal 2 is being stored in buffer B, the LDPC decoder begins to decode received signal 1 from buffer A. However, the time required to decode signal 1 is larger than one signal reception time. Therefore, the decoding time for signal 1 overlaps the time during which received signal 3 is stored in buffer C.

When received signal 1 is completely decoded, the LDPC decoder begins to operate on received signal 2 in buffer B. As this process continues, it can be seen from this example that certain received signals, far example, signal 1 in buffer A and signal 5 in Buffer B, may be decoded for a much longer time (more decoding iterations) than the reception time without any data loss.

A fifth embodiment involves using an LDPC decoder to provide feedback assist to a demodulator, particularly demodulators operated at a low signal to noise ratio, or in the presence of different interferences such as phase noise. In such cases, the output of the demodulator, typically made to the Forward Error Correction (FEC) modules that usually follow it, may indicate the wrong symbol from the applicable symbol constellation. In this embodiment, side information generated downstream from the demodulator, for example, the output of a LDPC decoder included within the FEC modules having a lower error rate than the demodulator output, and tending to indicate whether a particular symbol output by the demodulator is the correct one, is fed back for use by the demodulator in reselecting the symbol in question, or selecting future symbols. Armed with this side information, the demodulator, with an incremental amount of redundant processing, is able to improve the quality of its output. Moreover, the feedback delay between the output of the LDPC decoder and the input of the demodulator is kept small, for example, by providing the demodulator output to the decoder input in real time, without delay through storage in a buffer, the performance gain will improve.

Figure 10:
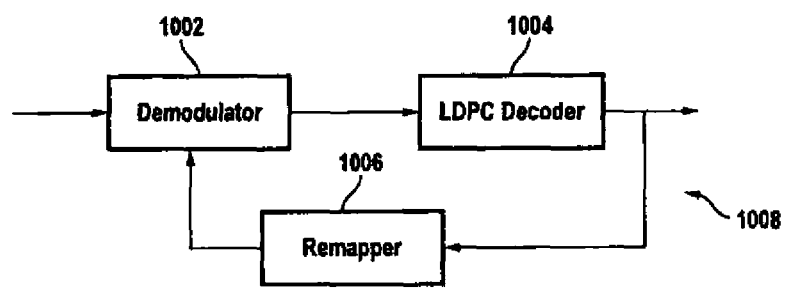
FIG. 10 is a block diagram of a system where a LDPC decoder provides feedback assist to a demodulator.

Referring to FIG. 10, a system in accordance with this fifth embodiment comprises a demodulator 1002 for receiving a signal, formed by mapping LDPC encoded information into symbols using a suitable symbol constellation, and demodulating the signal into symbol estimates at baseband frequencies. The system further comprises a LDPC decoder 1004, configured to decode the symbol estimates into bit estimates. A feedback loop 1008 includes a remapper 1006, and inputs the bit estimates to the remapper 1006, which is configured to remap the bit estimates output from LDPC decoder 1104 into symbols from the symbol constellation employed by demodulator 1002. The remapped symbols output from remapper 1006 are provided by the feedback loop 1008 to the demodulator 1002, which uses this information to reselect symbols or newly select symbols with enhanced reliability. An interleaver (not shown) may also be provided in the feedback loop between the decoder output and the remapper input. The LDPC decoder is operated again with the improved input as provided by the demodulator.

Several methods are possible for minimizing any delay in feedback to the demodulator, including:
1. Providing the feedback signal to the demodulator after only a small, fixed number of decoding iterations, and then, after the demodulator has re-processed the signal, performing any remaining iterations on the re-processed signal as output from the demodulator.
2. Providing the feedback signal to the demodulator as soon as the number of unresolved parity check equations is smaller than a programmable threshold, and then, after the demodulator has reprocessed the signal, performing any remaining iterations on the re-processed signal as output from the demodulator.

It is also possible to feedback to the demodulator, along with the remapped symbols, a soft quantity indicative of the level of reliability of every remapped symbol, for example, the probability that a remapped symbol is correct. For a constellation symbol of n bits, this probability is:

$$P = \prod_{i=0}^{n-1} P_i \quad (1)$$

where $P_i$ is the probability each bit is correct. In the case where the LDPC decoder operates on inputted Log Likelihood Ratios (denoted with $\lambda_i$), the reliability measure RM for symbol k is:

$$RM^{(k)} = \sum_{i=0}^{n-1} \left| \lambda_i^{(k)} + \sum_j \gamma_j^{(k)} \right| \quad (2)$$

where $\gamma^{(k)}_i$ are the extrinsic check node messages sent to the bit node indexed by i.

A sixth embodiment comprises a memory configuration, comprising one or more memories, for efficient parallel memory access. In a hardware implementation of a LDPC decoder, having several processing units working simultaneously on different check nodes, such a memory configuration is desirable because it allows these node processors to access the memory in parallel, for example, to store extrinsic messages destined for the bit nodes.

Figure 11A:
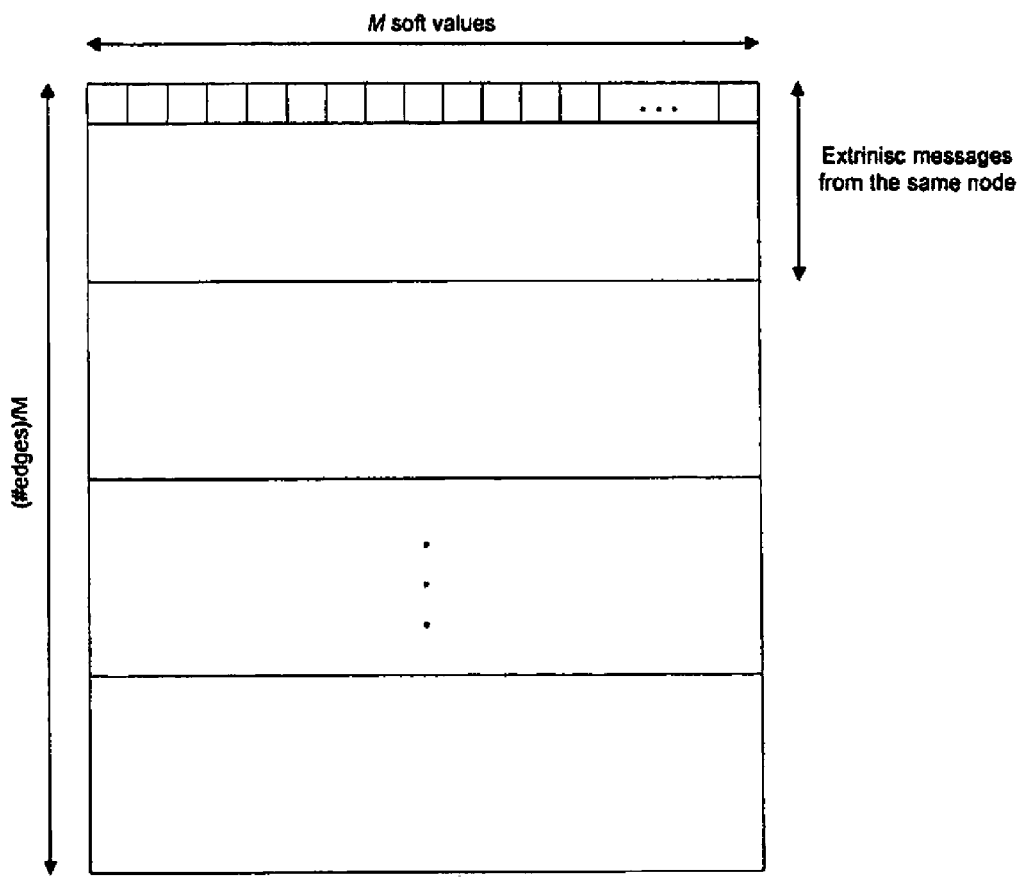
FIG. 11(a) illustrates a novel memory configuration for storing check node to bit node messages generated in the course of check node processing, and FIG. 11(b) an example of this configuration in the case where every qth check node forms a check node group.

Referring to FIG. 11(a), the memory has a size of size M× N, where each memory element is composed of several bits for storage of a soft value. The width of the memory M is larger or equal to the number of processing units. The length of the memory N (address space) is equal to or greater than the sum of all edges connecting bit nodes and check nodes divided by M. Extrinsic messages from the same node may be grouped together in consecutive addresses in the memory.

FIG. 11(b) illustrates an example of such a memory configuration that is tailored for use by LDPC decoders that simultaneously process nodes having indexes that are separated by a factor of q. As shown, each row address stores elements from nodes with indexes separated by a factor of q. Also, as shown, each row may be cyclically shifted by a different value, for example, the first row is circularly shifted by 0, the second row is circularly shifted by 1, the third row is circularly shifted by 2, etc.

A seventh embodiment comprise a method for computing check node to bit node messages, for example, Log Likelihood Ratios (LLR), through one or more pair-wise computations as described, for example, in Frank R. Kschischang, Brendan J. Frey and Hans-Andrea Loeliger, "Factor Graphs and the Sum-Product Algorithm," IEEE Trans. on Information Theory, Vol. 47, No. 2, February 2001, which is fully incorporated by reference herein as though set forth in full.

In the case where bit estimates expressed as LLR values, a pair-wise operation for two LLR values $\lambda_1$ and $\lambda_2$ can be expressed as:

$$f(\lambda_1, \lambda_2) = 2 \tan h^{-1}(\tan h(\lambda_1/2) \cdot \tan h(\lambda_2/2)) \quad (3)$$

This operation can also be approximated as:

$$\tilde{f}(\lambda_1, \lambda_2) = \text{sign}(\lambda_1) \cdot \text{sign}(\lambda_2) \cdot \min(|\lambda_1|, |\lambda_2|) + \delta(||\lambda_1| - |\lambda_2||) \quad (4)$$

where the function $\delta(\cdot)$ is implemented with a look-up table.

Figure 12A:
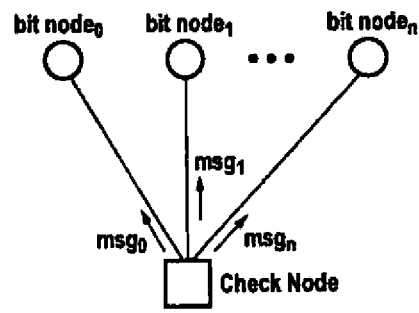
FIG. 12(a) depicts check node to bit node message generation in the context of a check node connected to several bit nodes.

Referring to FIG. 12(a), a method of computing check node to bit node messages through pair-wise LLR computations in accordance with this seventh embodiment assumes a check node connected to n+1 bit nodes, where n is an integer of one or more, and involves computing a message for each of the bit nodes.

Figure 12B:
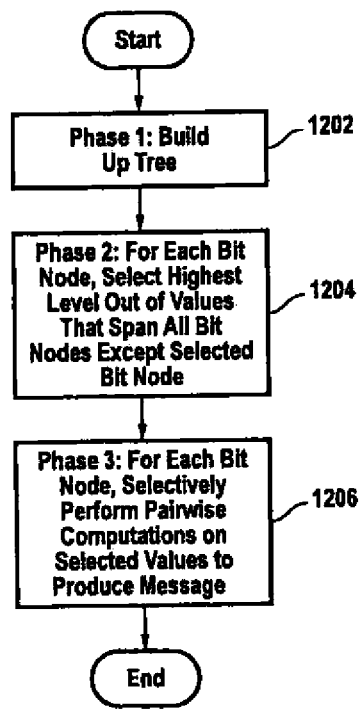
FIG. 12(b) is a flowchart of a phased method of generating such messages through successive pair-wise computations to build up a spanning tree, followed by successive pair-wise computations applied to selected members of the tree.

FIG. 12(b) is a flowchart of the method. As illustrated, the method has three phases, corresponding, respectively, to boxes 1202, 1204, and 1206. In box 1202, a series of pair-wise LLR computations are performed, starting with the LLR bit estimates corresponding to the bit nodes, to build up a base-2 logarithmic ($\log_2$) tree. Assuming that n+1 is a power of 2, this step involves first performing a pair-wise operation between the inputs $X_{2i}$ and $X_{2i+1}$ for i=0, 1, . . . , ((n+1)/2)−1, producing the results $L^1_i$ for i=0, 1, . . . , ((n+1)/2)−1. In the next level of the tree, pair wise operations are performed between the results of the previous level $L^1$ to produce $L^2_i$ for i=0, 1, . . . , ((n+1)/4)−1. This procedure is repeated until a tree with only two values at the topmost level remain.

Figure 13:
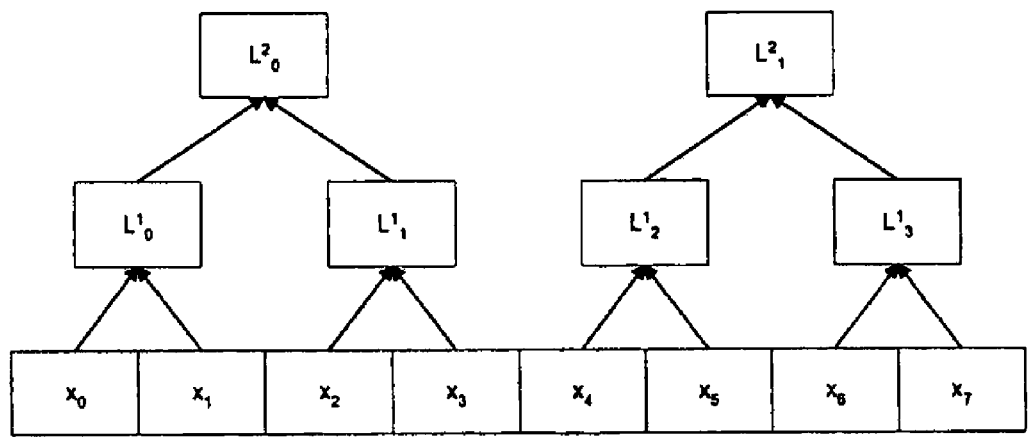
FIG. 13 depicts an example of a spanning tree of pair-wise computations for the case in which the number of bit nodes is 8.

FIG. 13 shows the resulting tree for n=7. The series of pair-wise computations that yield this tree are shown in the following table:

| Phase | Operation number | Operation |
|---|---|---|
| 1 | 1 | $L^1_0 = f(X_0, X_1)$ |
|  | 2 | $L^1_1 = f(X_2, X_3)$ |
|  | 3 | $L^1_2 = f(X_4, X_5)$ |
|  | 4 | $L^1_3 = f(X_6, X_7)$ |
|  | 5 | $L^2_0 = f(L^1_0, L^1_1)$ |
|  | 6 | $L^2_1 = f(L^1_2, L^1_3)$ |

Figure 14:
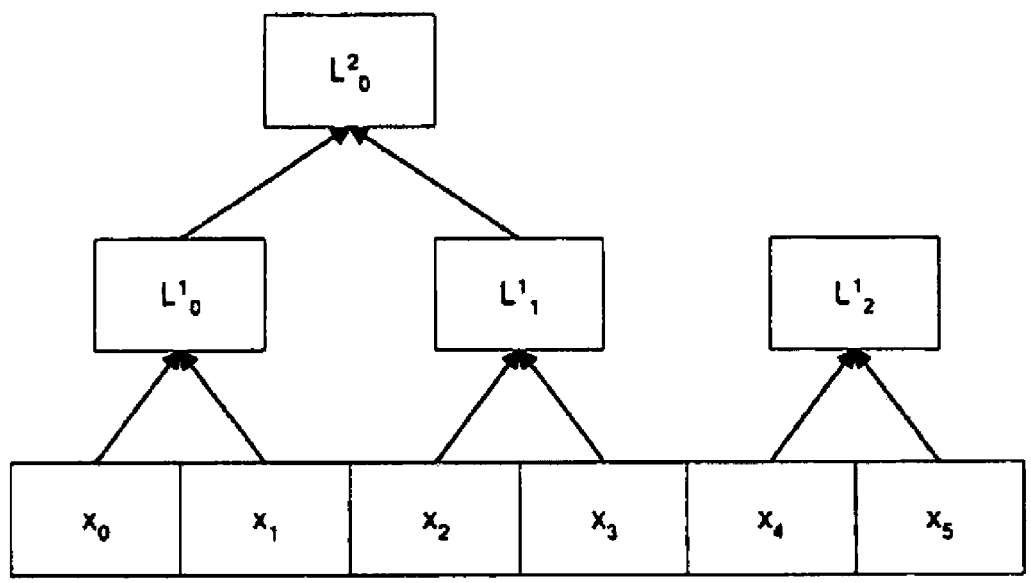
FIG. 14 depicts an example of a spanning tree of pair-wise computations for the case in which the number of bit nodes is 6.

FIG. 14 shows the resulting tree for n=5. The series of pair-wise computations that yield this tree are as follows:

| Phase | Operation number | Operation |
|---|---|---|
| 1 | 1 | $L^1_0 = f(X_0, X_1)$ |
|  | 2 | $L^1_1 = f(X_2, X_3)$ |
|  | 3 | $L^1_2 = f(X_4, X_5)$ |
|  | 4 | $L^2_0 = f(L^1_0, L^1_1)$ |

Turning back to FIG. 12(b), the second phase comprises box 1204, selecting, for each bit node, the highest level set of values from the tree that span all bit nodes except the bit node in question. The third phase comprises box 1206, performing pair-wise computations from the values selected in phase 2 (box 1204) to compute the message for the bit node.

For example, referring to FIG. 13, for bit node 0, the highest set of values that span all bit nodes but exclude bit node 0 are the values $L^2_1$, $L^1_1$, and $X_1$. In the table below, the phase 3 pair-wise computations that yield the message for this node are computations 7 and 11:

| Phase | Operation number | Operation |
|---|---|---|
| 3 | 7 | $T_0 = f(L^1_1, L^2_1)$ |
|  | 8 | $T_1 = f(L^1_0, L^2_1)$ |
|  | 9 | $T_2 = f(L^1_2, L^2_0)$ |
|  | 10 | $T_3 = f(L^1_3, L^2_0)$ |
|  | 11 | $Y_0 = f(T_0, X_1)$ |
|  | 12 | $Y_1 = f(T_0, X_0)$ |
|  | 13 | $Y_2 = f(T_1, X_3)$ |
|  | 14 | $Y_3 = f(T_1, X_2)$ |
|  | 15 | $Y_4 = f(T_3, X_5)$ |
|  | 16 | $Y_5 = f(T_3, X_4)$ |
|  | 17 | $Y_6 = f(T_2, X_7)$ |
|  | 18 | $Y_7 = f(T_2, X_6)$ |

As another example, again referring to FIG. 13, for bit node 4, the highest level set of values that span all bit nodes but exclude bit node 4 are $L^2_0$, $X_5$, and $L^1_3$. In the table above, the phase 3 computations that yield the message for this bit node are computations 10 and 15.

As a third example, for the case where n=5, referring to FIG. 14, the highest level set of values that span all bit nodes except for bit node 1 are $X_0$, $L^1_1$ and $L^1_2$. In the table below, the computations that yield the message for bit node 1 are computations 5 and 8.[31]

| Phase | Operation number | Operation |
|---|---|---|
| 3 | 5 | $T_0 = f(L^1_1, L^1_2)$ |
|  | 6 | $T_1 = f(L^1_0, L^1_2)$ |
|  | 7 | $Y_0 = f(T_0, X_1)$ |

| Phase | Operation number | Operation |
|---|---|---|
|  | 8 | $Y_1 = f(T_0, X_0)$ |
|  | 9 | $Y_2 = f(T_1, X_3)$ |
|  | 10 | $Y_3 = f(T_1, X_2)$ |
|  | 11 | $Y_4 = f(L^2_0, X_5)$ |
|  | 12 | $Y_5 = f(L^2_0, X_4)$ |

As a fourth example, referring to FIG. 14, the highest level set of values that span all bit nodes but exclude bit node 5 are $L^2_0$ and $X_4$. In the table above, the computation that yields the message for bit node 5 is computation 12.

An eighth embodiment addresses the problem that iterative LDPC decoders are not guaranteed to converge to the corrected codeword even after many decoding iterations. Sometimes, especially in the hybrid LDPC decoder that is configured to perform the FIG. 1 method, the iterative decoding process converges into a non-codeword. This means that, no matter how many decoding iterations are performed, the decoder will have the same erroneous bits and the same unsolved parity equations. The eighth embodiment detects this situation and allows it to converge correctly to the nearest codeword.

Figure 15:
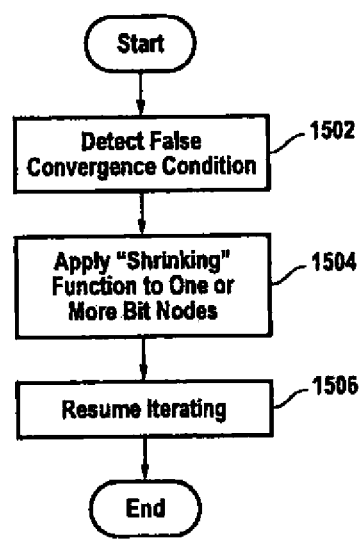
FIG. 15 is a flowchart of a method of overcoming a false convergence condition in a LDPC decoder by tracking the number of unresolved parity check equations by iteration to detect the condition, and, in response, applying a "nudge" algorithm, for example, a "shrinking" algorithm to the estimates for one or more bit nodes reflected in the unresolved equations, and then resuming iterations.

More specifically, referring to FIG. 15, the eighth embodiment, in box 1502, detects the convergence into a non-codeword responsive to the number of unresolved parity equations, for example, after observing that the change in this number of two or more consecutive iterations falls below a predetermined threshold, or observing that this number does not change for a predetermined number of consecutive decoding iterations. If so, box 1504 is performed. In box 1504, a so-called "nudge" algorithm applied to overcome the false convergence condition.

According to this "nudge" algorithm, a "shrinking" function is applied to some or all of the bit nodes that participate in some or all of the unresolved equations. More specifically, it is applied to the probability related metrics associated with these bit nodes. A shrinking function f(x) satisfies the following rule: $|f(x)| \leq |x|$, where x is the probably related metric associated with a bit node. For example, the function $f(x)=a \cdot x$, where $0<a<1$, is an example of a shrinking function. Through application of this shrinking function, the decoder convergence point changes. Accordingly, after application of the shrinking function, as represented by box 1506 in FIG. 15, the decoder is allowed to iterate again. If a suitable shrinking function is applied, the decoder should converge correctly into the correct codeword.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method of iteratively decoding LDPC encoded information comprising:
   producing, for an iteration of the method, estimated information;
   checking whether the estimated information fully resolves a plurality of parity check equations;
   if the estimated information fully resolves the plurality of parity check equations, or if the estimated information for the iteration does not fully resolve the plurality of parity check equations, but the number of unresolved parity check equations achieves a minimum. outputting, as decoded information, the estimated information produced in that iteration and then ceasing iterations; and if the estimated information for the iteration does not fully resolve the plurality of parity check equations, and the number of unresolved parity check equations does not achieve a minimum, performing at least additional iteration.

2. The method of claim 1 wherein the minimum that must be achieved is a local minimum.

3. The method of claim 1 wherein the minimum that must be achieved is a first, local minimum.

4. The method of claim 1 wherein the minimum that must be achieved is a global minimum.

5. The method of claim 1 wherein the estimated information is written to an output memory every iteration, and the step of ceasing iterations when the number of unresolved parity check equations achieves a minimum avoids unnecessary write operations.

6. A method of iteratively decoding LDPC encoded information encoded with an outer block code, comprising:

producing, in an iteration of the method, estimated information;

if the estimated information does not fully resolve a plurality of applicable parity check equations, so that a number of unresolved parity check equations remain, but the number of unresolved parity check equations falls below a predetermined threshold, decoding the estimated information by a decoder of the outer block code; and if the number of unresolved parity check equations equals or exceeds a predetermined threshold, performing one or more additional iterations.

7. The method of claim 6 further comprising terminating the LDPC iterations if the outer block decoder successfully decodes the estimated information.

8. A method of iteratively decoding LDPC encoded information comprising:

producing, in an iteration of the method, estimated information;

if the estimated information fully resolves a plurality of applicable parity check equations, outputting the estimated information as decoded information;

if the estimated information does not fully resolve a plurality of applicable parity check equations, so that a number of unresolved parity check equations remain, each unresolved parity check equations defining a check node connected to one or more bit nodes, and each bit node having a corresponding bit estimates, and a false convergence condition is detected, indicating the method. had converged to an invalid code word, (1) applying a shrinking algorithm to updated one or more bit estimates corresponding to one or more bit node that is reflected in at least one of the unresolved parity check equations, and (2) resuming decoding iterations based on the updated one or more bit estimates; and if the estimated information does not fully resolve the plurality of applicable parity check equations, and a false convergence condition is not detected, performing one or more additional iterations of the method.

9. The method of claim 8 further comprising detecting a false convergence condition when a rate of change of the number of unresolved parity check equations in successive iterations falls below a predetermined threshold.

* * * * *